(12) United States Patent
Boskamp et al.

(10) Patent No.: US 6,249,121 B1
(45) Date of Patent: Jun. 19, 2001

(54) RF BODY COIL

(75) Inventors: Eddy B. Boskamp, Menomonee Falls, WI (US); John F. Schenck, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/313,339

(22) Filed: May 17, 1999

(51) Int. Cl.$^7$ ............................................. G01V 3/00
(52) U.S. Cl. ................................. 324/318; 600/422
(58) Field of Search ........................... 324/318, 322, 324/300, 306, 307, 309; 600/423, 424

(56) References Cited

U.S. PATENT DOCUMENTS

| | | | |
|---|---|---|---|
| 4,613,837 | * 9/1986 | Blass et al. | 333/219 |
| 4,829,252 | 5/1989 | Kaufman | 324/309 |
| 4,968,937 | 11/1990 | Akgun | 324/318 |
| 5,270,656 | * 12/1993 | Roberts et al. | 324/318 |
| 5,280,248 | * 1/1994 | Zou et al. | 324/318 |
| 5,386,191 | 1/1995 | McCarten et al. | 324/318 |
| 5,467,017 | 11/1995 | Duerr et al. | 324/318 |
| 5,521,571 | 5/1996 | Laskaris et al. | 335/316 |
| 5,559,434 | 9/1996 | Takahashi et al. | 324/318 |
| 5,574,417 | 11/1996 | Dorri et al. | 335/216 |
| 5,663,645 | 9/1997 | Kaufman et al. | 324/318 |
| 5,696,449 | 12/1997 | Boskamp | 324/318 |
| 5,696,476 | 12/1997 | Havens et al. | 335/316 |
| 5,818,232 | * 10/1998 | Mehr et al. | 324/318 |
| 5,898,306 | 4/1999 | Liu et al. | 324/318 |

* cited by examiner

Primary Examiner—Louis Arana
(74) Attorney, Agent, or Firm—Kilpatrick Stockton, LLP; Charles W. Calkins; James J. Bindseil

(57) ABSTRACT

The present invention comprises a whole body RF coil system for use with an open magnetic resonance (MR) imaging system. The RF coil system comprises first and second quadrature RF coil sets positioned on opposing sides of an imaging volume. Each RF coil set comprises similarly-structured, multiple RF coils. Each quadrature RF coil comprises a first and second plurality of primary path conductor segments, and first and second return path conductors, symmetrically disposed about a centerline at specified distances. The first and second plurality of primary path conductor segments are positioned in a first plane that is substantially spaced apart from a second plane, further from the imaging volume, containing the first and second return path conductors. The conductors within each of the first and second set of primary path conductor segments are adapted to have a predetermined current amplitude ratio. Upon energization of the first and second RF coil sets in quadrature to generate a circular, polarized $B_1$ field, the positioning of the conductors and the predetermined current amplitude ratio provide a desired homogeneity within the imaging volume and a desired sensitivity drop-off outside of the imaging volume.

37 Claims, 11 Drawing Sheets

RF BODY COIL

BACKGROUND OF THE INVENTION

The present invention relates to a magnetic resonance (MR) imaging system, and more particularly, to a radio frequency (RF) coil system for use within an MR imaging system.

A magnetic resonance (MR) imaging system provides an image of a patient or other object in an imaging volume based on detected radio frequency (RF) signals from precessing nuclear magnetic moments. A main magnet produces a static magnetic field, or $B_0$ field, over the imaging volume. Similarly, gradient coils within the MR imaging system are employed to quickly switch into effect magnetic gradients along mutually orthogonal x,y,z coordinates in the static $B_0$ field during selected portions of an MR imaging data acquisition cycle. Meanwhile, a radio frequency (RF) coil produces RF magnetic field pulses, referred to as a $B_1$ field, perpendicular to the $B_0$ field, within the imaging volume to excite the nuclei. The nuclei are thereby excited to precess about an axis at a resonant RF frequency. These nuclear spins produce a spatially-dependent RF response signal when proper readout magnetic field gradients are applied to them. The RF coil also is able to detect the RF response signal of the precessing nuclear spins and forwards the detected signal to the MR imaging system. The MR imaging system combines the detected RF response signals to provide an image of a portion of the body or object in the imaging volume.

In order to produce accurate images, the static $B_0$ magnetic field, the magnetic field gradients and the $B_1$ field generated by the RF coil need to be spatially homogeneous over the imaging volume. Traditionally, to produce homogeneous fields and gradients, the main magnet and gradient and RF coils have a cylindrical shape which completely surrounds the patient. In such systems, the $B_0$ field is typically horizontal, running parallel to the longitudinal axis of the bore of the cylinder. The cylindrical shape and complete encasement of the patient insure a highly homogeneous imaging volume. The cylindrical configuration is disadvantageous, however, in that it severely limits access to the patient and the imaging volume. The cylindrical geometry makes it difficult, if not impossible, for a doctor to perform interactive procedures during an MR imaging scan. Additionally, many patients find the cylindrical bore of such traditional MR systems to be cramped, restricting the size of patients that can be examined and also causing claustrophobic reactions in some patients. Thus, alternatives to the traditional cylindrical geometry are needed.

In response to this need, open MR imaging systems have been developed. In an open MR system, the imaging volume is very accessible and open to both a patient and a doctor. This allows the access to the imaging volume for medical procedures, as well as alleviating the claustrophobic reaction of some patients. Some open MR systems utilize two disk-like magnet pole pieces positioned on opposite sides of the imaging volume with a vertical $B_0$ field. These systems have gradient coils and RF coils that are also flat and disk-like in shape. These open MR systems provide a great amount of access for a doctor or patient in the space between the two disk-like magnet pole pieces. Other open MR systems use two toroid-shaped magnet pole pieces positioned on opposite sides of the imaging volume. When set up with a horizontal $B_0$ magnetic field, the patient/doctor can access the imaging volume through the bore in the toroids or from the side. Since the magnet pole pieces are toroid-shaped, the corresponding gradient coils and RF coils are required to be similar in shape and flat to maximize the space between pole pieces. Thus, open MR systems alleviate the access and claustrophobia problems inherent with the traditional, closed system design.

Open MR systems are disadvantageous, however, in that it is more difficult to produce homogeneous magnetic fields within their imaging volume. In particular, the required flatness of the RF coil and other components in open MR systems. Similarly, because open MR systems do not completely surround a patient, it is difficult to obtain a high degree of homogeneity in the static $B_0$ magnetic field, the gradient magnetic fields, and the $B_1$ field.

One example of a typical open system RF coil is the dual butterfly design, which is especially inhomogeneous close to the conductors. A flat bird cage design in the form of a wheel and spoke structure may also be used, but it is also inhomogeneous near the conductors. As referred to herein, a system having a $B_1$ field with high homogeneity has substantially equal sensitivity to RF signal throughout the imaging volume. When there is inhomogeneity in the $B_1$ field, the sensitivity in the inhomogeneous area increases or decreases. This increase or decrease results in more or less RF signal being detected, resulting in bright spots or dark spots in the reconstructed MR image. So, for example, the area near the conductors in typical dual butterfly or flat bird cage designs are more sensitive than the rest of the imaging volume, thereby creating very bright areas or hot spots in the image.

Also, another disadvantage of typical flat RF coil designs is that the sensitivity does not drop off quickly enough outside of the imaging volume, resulting in RF fields outside of the imaging volume affecting the image. Inside the imaging volume, the $B_0$ field, the gradient fields, and the RF field are designed to be as homogeneous as possible. Outside of the imaging volume, however, the homogeneity is not as controlled. As a result, in areas outside of the imaging volume, the superposition of inhomogeneous $B_0$ and $B_1$ fields and alinear gradient fields may give rise to aliasing of signal, where areas outside of the imaging volume generate a signal with the same frequency as areas inside the imaging volume. These outside signals may be detected and cause bright spots to be generated within the image. By sharply reducing the RF field sensitivity outside of the imaging volume, interaction of outside fields with the fields inside of the imaging volume is reduced. In typical prior art, the path of the return current is through the RF shield, in effect straight under the straight conductor. This results in a straight return current path along the center of the coil, where the return current path is not being used to produce a sharp drop off in sensitivity. As such, current RF coil designs typically result in stray RF fields outside of the imaging volume, the stray fields in combination with the non-linearity of the gradient coil and the inhomogeneity of the magnet can cause signal from far outside the imaging volume to fold into the image. Thus, in MR systems, it is desirable to produce a very sharp drop off in sensitivity outside of the imaging volume so that signal from outside of the imaging volume does not affect the image.

In addition to these disadvantages, the design of RF coils for open MRI systems have a number of other constraints. For example, the diameter of the RF coils is typically limited to the diameter of the magnet pole pieces. The diameter of flat RF coils, and their distance to the iso-center of the imaging volume, affects the ability of the coils to produce a homogeneous RF field. For example, it is easier to produce a homogeneous RF field inside an imaging volume when the diameter of the RF coils is equal to or greater than the distance from the RF coils to the iso-center of the imaging volume. As mentioned above, since the flatness of the RF coils already presents a homogeneity problem, restricting the allowable diameter of the RF coils adds another degree of difficulty to the problem.

Further, flat RF coils are inefficient compared to cylindrically-shaped coils that surround the imaging volume. Since flat RF coils are inefficient, they require a larger power amp than in a comparable closed MR system. A larger power amp is problematic because it adds additional cost to the system. Further, by requiring more power, the specific absorption ratio (SAR) of the RF fields generated by the RF coils may increase. As is known to those of skill in the art, SAR pertains to the level of electromagnetic energy which can be absorbed by a patient or medical personnel positioned in or close to the transmit RF coil of an MR system. Within the United States, for example, SAR limits are set by the Food and Drug Administration (FDA). Because of the tight spacing required for open MR systems, as mentioned above, the RF coils must necessarily be fairly close to the patient surface. Thus, the SAR limits can restrict the amount of power permitted to be utilized by the RF coils.

SUMMARY OF THE INVENTION

According to the present invention, an RF body coil for use in a magnetic resonance imaging system has a first and second set of primary path conductors connected to a first and second return path conductor for passing electrical current to create a $B_1$ field having a desired homogeneity with an imaging volume. The first set of primary path conductors is spaced parallel to the second set of primary path conductors, symmetrically positioned about a centerline dividing the RF coil. Further, the first and second return path conductors provide a return path for the electrical current and they are positioned radially outward from the first and second set of primary path conductors in order to produce a desired sensitivity drop-off outside of the imaging volume. Each of the conductors within each of the first and second set of primary path conductors is connected in parallel, while both of the first and second return path conductors are connected in series to each of the first and second set of primary path conductors. Preferably, the first and second set of primary path conductors are in a first plane and the first and second return path conductors are in a second plane, where the first plane is closer to the imaging volume and substantially spaced apart from the second plane so as to provide a desired specific absorption ratio (SAR) within the imaging volume. Thus, the desired homogeneity results from the spacing of the conductors and from a predetermined current amplitude ratio between the conductors within the first and second set of primary path conductors.

According to another embodiment, the present invention comprises an RF coil system for use with an MR magnet comprising a pair of magnet pole pieces positioned on opposing sides of an imaging volume. The RF coil system includes a pair of RF coil components positioned on opposing sides of the imaging volume, where each of the RF coil components has a plurality of conductive loops. The conductive loops of each of the RF coil components have a first and second set of primary path conductor segments for passing electrical current to create a $B_1$ field having a desired homogeneity within the imaging volume. The first and second set of primary path conductor segments are positioned parallel and symmetric to each other about a centerline in a first plane, where each conductor within each respective first and second set of primary path conductors segments is connected in parallel. The conductive loops also include a first and second return path conductor segment for providing a return path for the electrical current. Each of the return path conductor segments is serially-connected to opposite ends of the first and second set of primary path conductor segments. Each of the first and second return path conductor segments are positioned radially outward from the primary path conductors in a second plane that is substantially parallel to and spaced apart from the first plane. The spaced relationship between the planes provides a desired SAR within the imaging volume In each of the conductive loops, each of the first and second set of primary path conductor segments have at least a first straight conductor for passing a first current and a second straight conductor for passing a second current, wherein the first straight conductor is a specified spacing from the second straight conductor. Also, for each conductive loop, the outward radial positioning of the first and second return path conductor segments, a current amplitude ratio of the first current to the second current and the specified spacing between the first and second primary path conductors combine to provide the $B_1$ field with the desired homogeneity within the imaging volume and the desired sensitivity drop-off outside of the imaging volume.

DETAILED DESCRIPTION OF THE INVENTION

Figure 1:
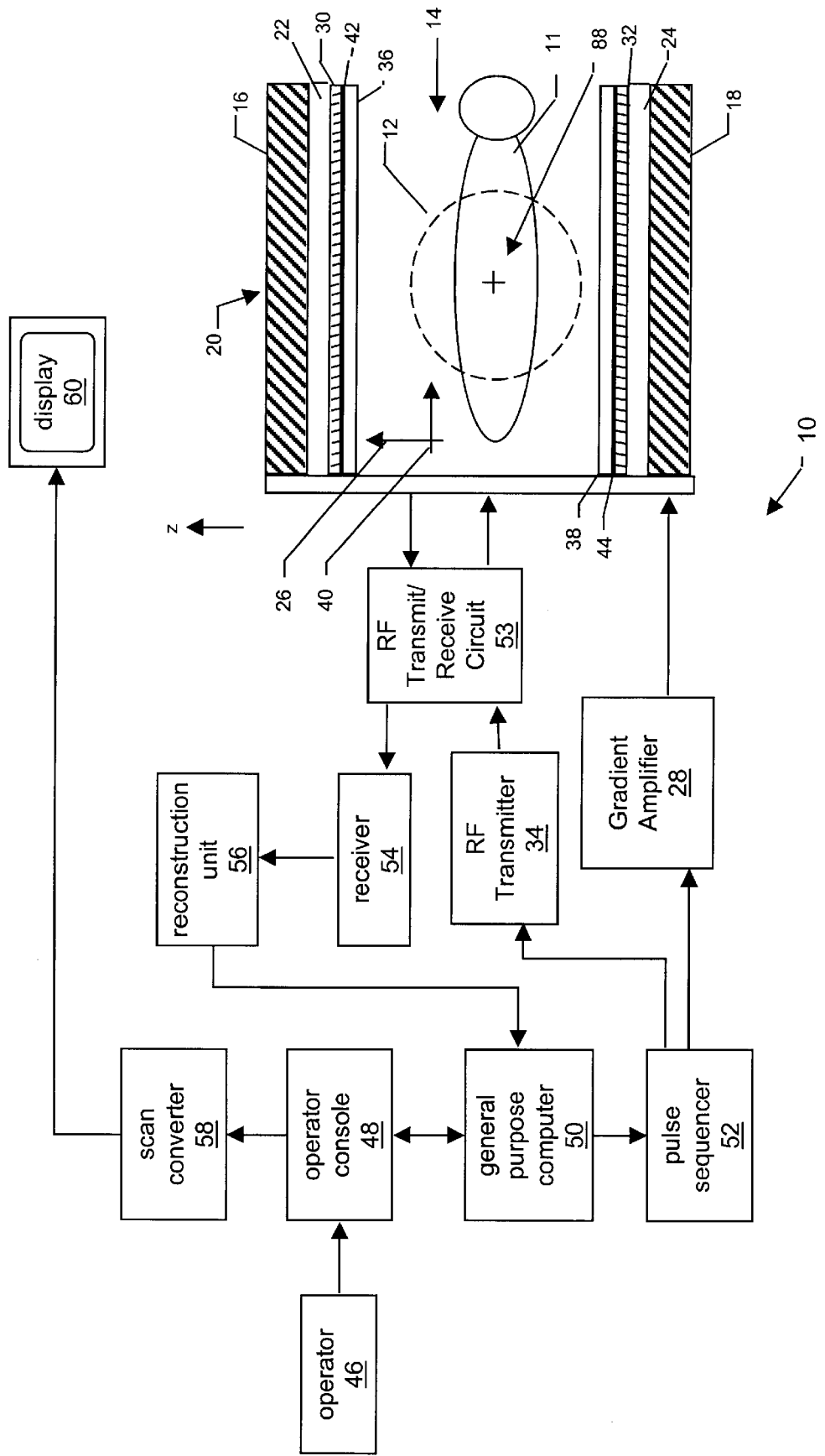
FIG. 1 is a schematic diagram representing a magnetic resonance imaging system of the present invention.

According to the present invention, referring to FIG. 1, a magnetic resonance (MR) imaging system 10 comprises a patient 11 positioned in an imaging volume 12 in open space 14 between a first magnetic pole piece 16 and a second magnetic pole piece 18 of an MR magnet assembly 20. MR magnet assembly 20 comprises a first and second shim disk 22 and 24, respectively adjacent first and second pole piece 16 and 18, to provide a uniform, static magnetic field 26, or $B_0$ magnetic field, across imaging volume 12. A gradient amplifier 28 provides power to a first gradient coil set 30 and a second gradient coil set 32, respectively located adjacent shim disks 22 and 24. The energized gradient coil sets 30 and 32, each comprising X-, Y-, and Z-axis gradient coils, produce a magnetic field gradient in the specified direction. RF transmitter 34 supplies the necessary power to anterior RF coil set 36 and posterior RF coil set 38, respectively located adjacent gradient coil sets 30 and 32. Energization of anterior and posterior RF coils sets 36 and 38 transmit RF energy to produce a circular, polarized $B_1$ magnetic field 40, that rotates perpendicular to the $B_0$ magnetic field 26. The $B_1$ field 40 excites nuclear spins within patient 11 in imaging volume 12. Sandwiched between each RF coil set 36, 38 and each gradient coil set 30, 32 is a first and second RF shield 42 and 44, respectively. First and second RF shields 42 and 44 prevent $B_1$, magnetic field 40 from penetrating gradient coil sets 30 and 32, thereby containing the RF energy inside the imaging volume and preventing a loss of RF energy within the gradient coils.

Typically, based upon parameters input by an operator 46 through operator console 48, a general purpose computer 50 activates pulse sequencer 52 to initiate an MR data acquisition cycle. Pulse sequencer 52 controls the timing and activation of gradient amplifier 28 and RF transmitter 34 that energize RF transmit/receive circuit 53 to produce magnetic field gradients and RF energy. The gradient magnetic fields and RF energy excite nuclear spins and cause an MR response signal to be emitted by tissue of patient 11 at a specified image plane within imaging volume 12. RF transmit/receive circuit 53 receives the emitted MR response signal from imaging volume 12 of patient 11 and forwards the signal to receiver 54. RF transmit/receive circuit 53 may acquire the emitted MR response signal from anterior and posterior RF coil sets 36 and 38. Alternatively, RF transmit/receive circuit 53 may additionally comprise an RF surface coil (not shown) for receiving the MR response signal. Receiver 54 receives and amplifies the emitted MR response signal, and provides this signal to a reconstruction unit 56. Reconstruction unit 56 produces data for an MR image of patient 11 at the imaging plane. The image data is provided to general purpose computer 50 which displays an MR image on operator console 48. An output of operator console 48 may provide the data to a scan converter 58 which changes the format of the signal and provides it to a display 60. Display 60 may provide the image of the image plane to aid the physician during a medical procedure, such as surgery.

Figure 2:
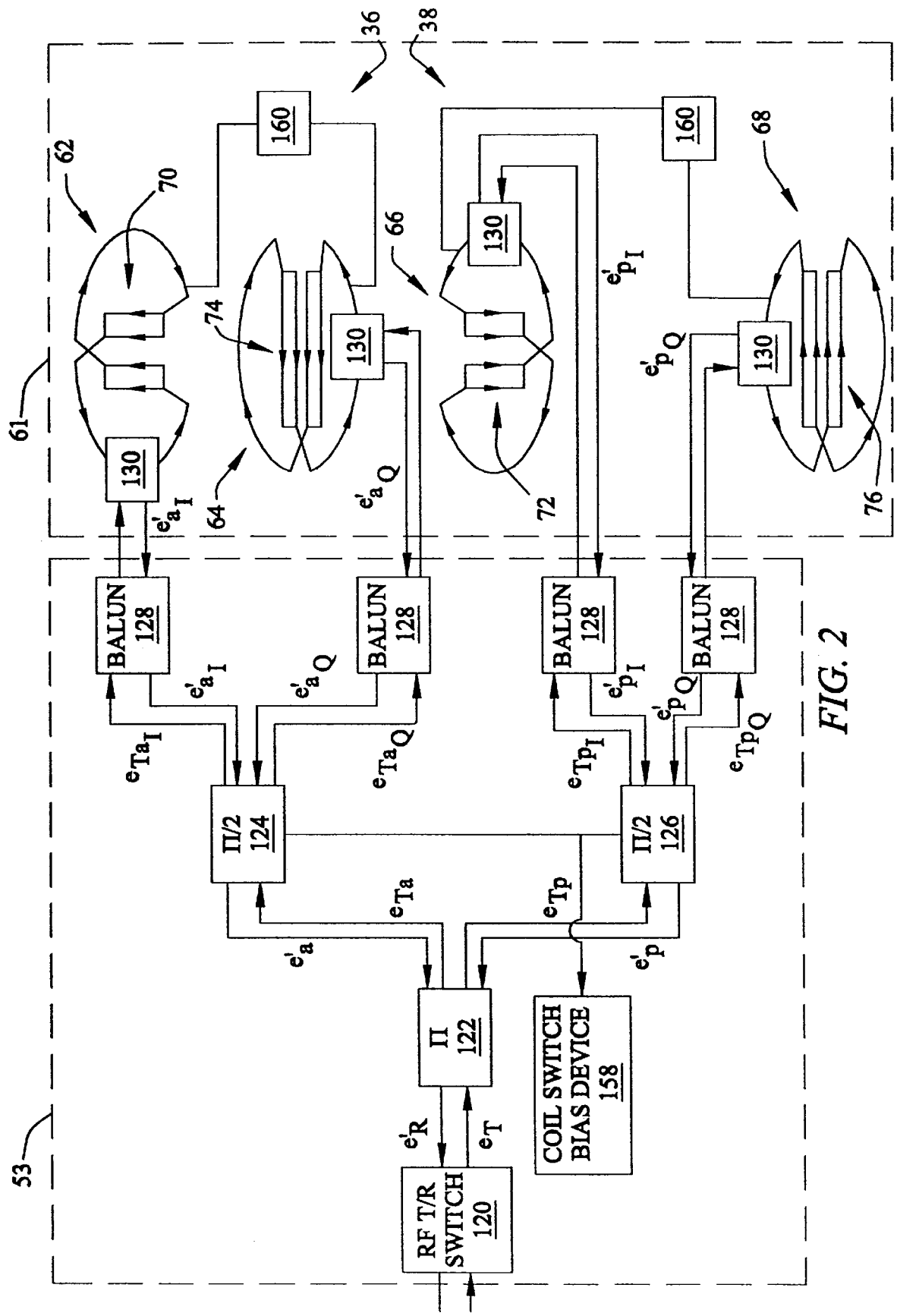
FIG. 2 is a schematic diagram representing one embodiment a transmit/receive circuit and an RF coil system of the present invention.
Figure 3:
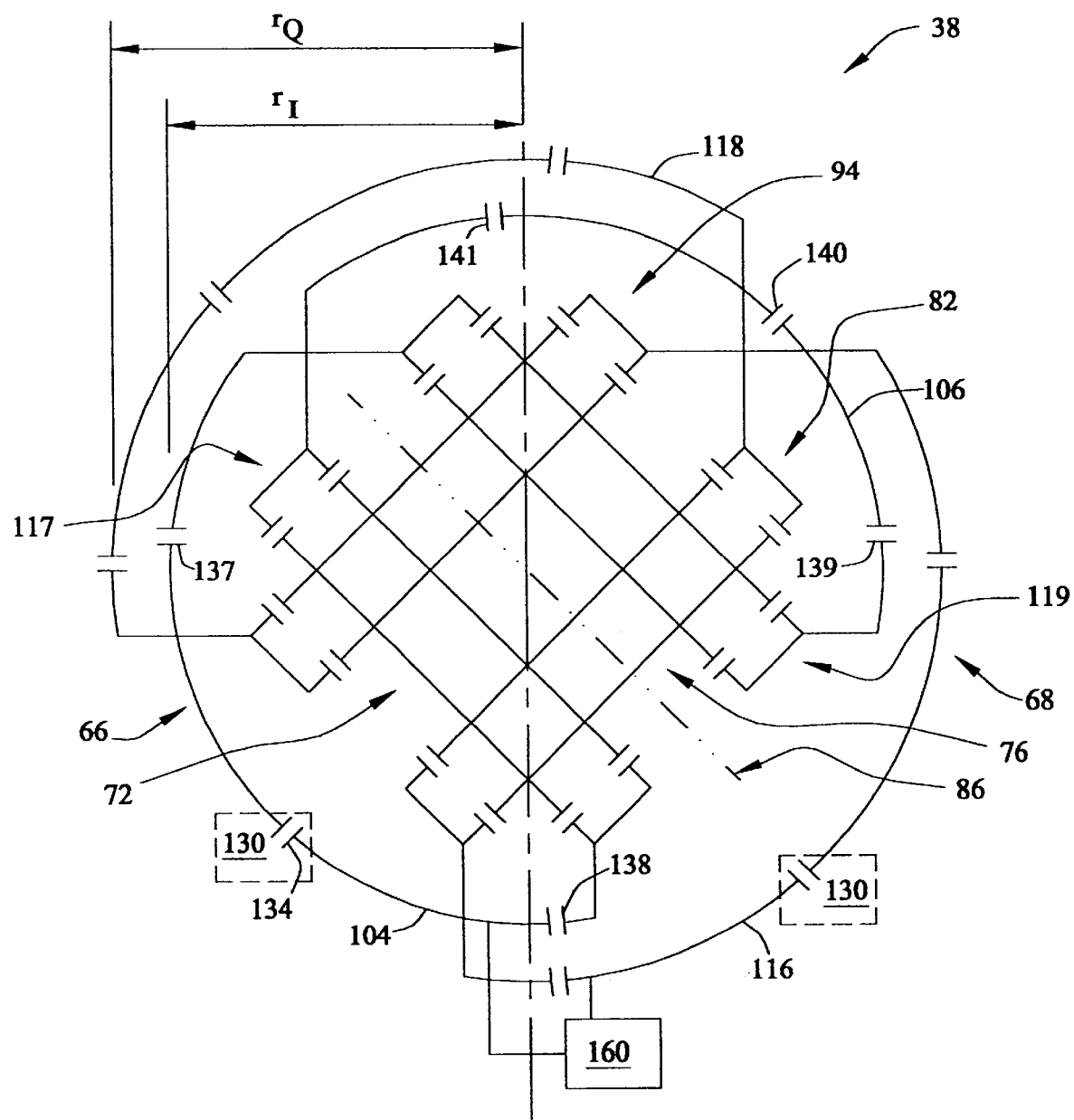
FIG. 3 is a schematic view of the structure of a posterior RF coil set.

Referring to FIGS. 2 and 3, RF coil sets 36 and 38 each comprise multiple coils in a similar quadrature structure that combine to form an RF coil system 61. RF coil sets 36 and 38 are preferably substantial mirror images of each other. Being quadrature coils, each RF coil set 36 and 38 contains an I-channel coil and a Q-channel coil. The currents in the I- and Q-channel coils for anterior RF coil set 36 are about 180 degrees out of phase, respectively, with the currents in the I- and Q-channel coils in posterior RF coil set 38. Similarly, within each RF coil set 36 and 38, the currents in the I- and Q-channel coils are about 90 degrees out of phase with each other. For example, anterior RF coil set 36 comprises a quadrature structure having I-channel coil 62 and Q-channel coil 64 structurally and electrically positioned at about 0 degrees and 90 degrees, respectively.

Similarly, posterior coil set 38 comprises I-channel coil 66 and Q-channel coil 68 structurally and electrically positioned at about 180 degrees and 270 degrees, respectively. The primary path conductors 70 and 72 from I-channel coils 62 and 66 make an angle of about 90 degrees with the primary path conductors 74 and 76 of the Q-channel coils 64 and 68. As such, the associated magnetic fields from the I-channel coils 62 and 66 are substantially perpendicular to the associated magnetic fields from the Q-channel coils 64 and 68. Thus, these substantially perpendicular magnetic fields result in a substantially circular, polarized $B_1$ field 40 (FIG. 1) when the coils are driven with the phase shifting described herein.

The structure of each RF coil set 36 and 38, and the relative position of each coil component to iso-center 88, have a dramatic affect on the homogeneity of the $B_1$ field 40 within imaging volume 12, the sensitivity drop-off outside of the imaging volume, and the SAR exposure on patient 11. In particular, the spacing between each of the primary path conductors, combined with their distance to imaging volume 12 and the ratio of the current amplitudes in the primary path conductors, have a major affect on the homogeneity of the $B_1$ field inside the imaging volume. Also, the positioning of the return path conductors and their distance to imaging volume 12 has a drastic effect on the amount of sensitivity drop-off outside the imaging volume. And finally, the distance of the return path conductors and the primary path conductors to the RF shield and the imaging volume has a significant affect on the sensitivity drop-off, homogeneity within the imaging volume and SAR exposure on patient 11.

Figure 4:
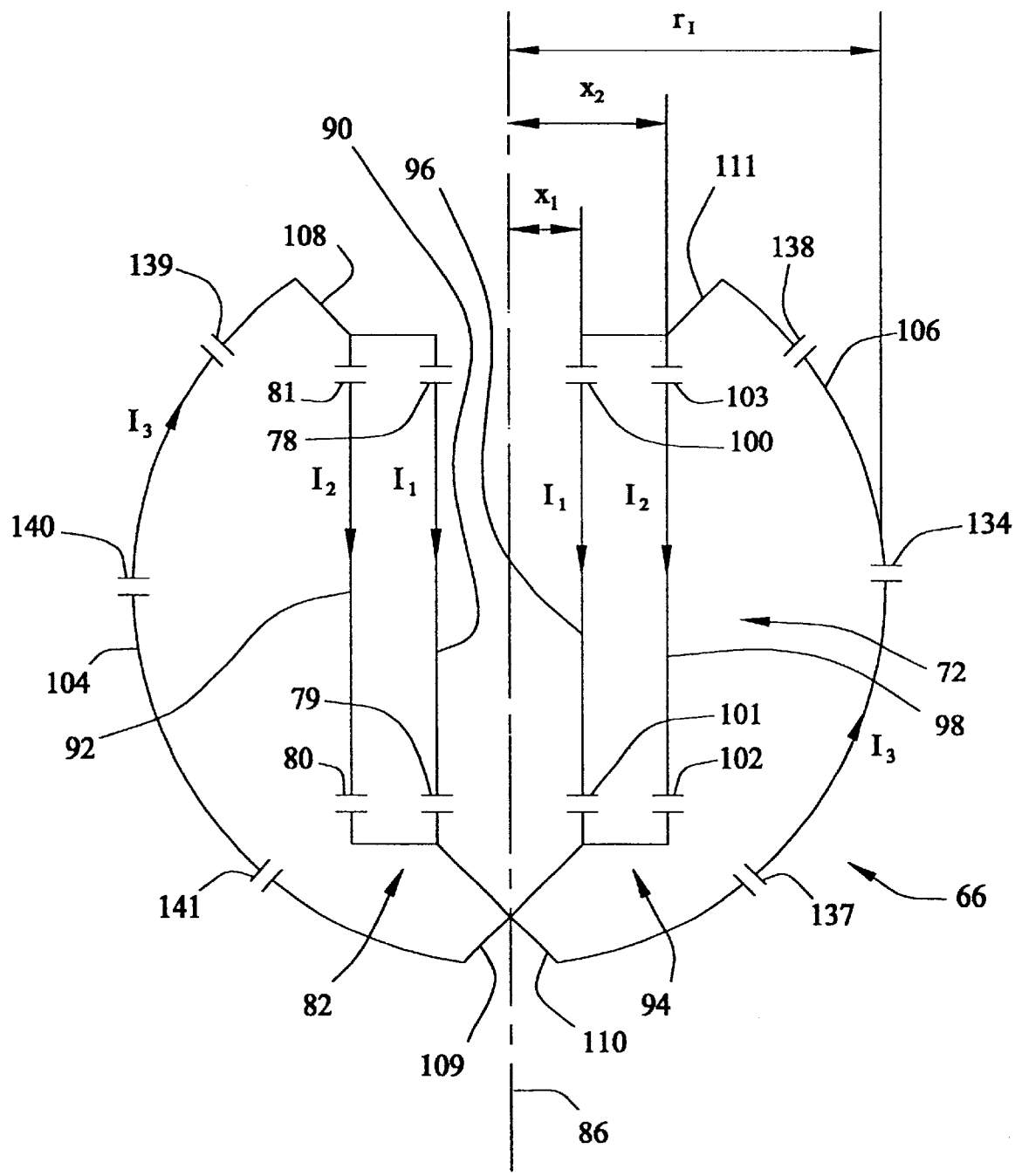
FIG. 4 is a schematic view of an I-channel coil of the posterior RF coil set in FIG. 3.

The structure of each coil 62, 64, 66, 68 is similar. Using posterior I-channel coil 66 as an example, referring to FIG. 4, each coil comprises primary path conductors 72 in which the peak current amplitudes $I_1$ and $I_2$ can be varied by means of capacitors to provide a homogeneous, circular, polarized $B_1$ field 40. Preferably, primary path conductors 72 comprise a first set of primary path conductor segments 82, electrically connected in parallel. Each conductor of the first set of conductor segments 82 is preferably substantially parallel to a central axis 86. Central axis lies within a central plane 87 (FIG. 6) that intersects iso-center 88 of imaging volume 12. First set of straight conductor segments 82 comprises at least a first primary path conductor segment 90 and preferably a second primary path conductor segment 92. Corresponding to primary path conductor segments 90 and 92, the current amplitudes $I_1$ and $I_2$, and hence the value of capacitors 78–81, may vary depending on the distance of each primary path conductor segment to the imaging volume and the desired homogeneity based on the Biot-Savart law, as is explained below.

The ratio of the currents $I_1$ and $I_2$ determines the homogeneity within imaging volume 12. As one skilled in the art will realize, however, the amplitude of the current depends totally on the required $B_1$ field amplitude. Therefore, the value of the peak current amplitudes for $I_1$ and $I_2$ will vary with the requirements for each system.

Primary path conductors 72 additionally comprise a second set of primary path conductor segments 94 disposed symmetric to first set of primary path conductor segments 82 about central axis 86. Second set 94 also comprises first and preferably second primary path conductor segments 96 and 98, and capacitors 100–103, having similar current amplitude and capacitive characteristics as first and second conductor segments 90 and 92 and capacitors 78–81, respectively. The relative positioning of primary path conductor segments 90, 92, 96 and 98 is symmetric about central axis 86.

As mentioned above, primary path conductors 72 comprise first and second set of conductor segments 82 and 94. Each set of conductor segments 82 and 94 includes at least one conductor segment. To improve the homogeneity of $B_1$ field 40 with imaging volume 12, however, each set of conductor segments 82 and 94 preferably includes at least two conductor segments. Increasing the number of conductor segments within each set 82 and 94 improves the ability to achieve a desired level of homogeneity.

First and second primary path conductor segments for each set 82 and 94 are respectively positioned a specified distance $x_1$ and $x_2$ from central axis 86. The specified distances $x_1$ and $x_2$ from central axis 86 respectively also correspond to a distance to imaging volume 12. As is discussed below, the Biot-Savart law uses the values for $x_1$ and $x_2$, in combination with the ratio of currents $I_1$ and $I_2$, to determine the desired $B_1$ field 40. Accordingly, for each set of primary path conductor segments 82 and 94 in each coil, the distance to central axis 86 and the current amplitude ratio of the conductors are set to achieve a desired homogeneity of the $B_1$ field with respect to iso-center 88. The homogeneity of the $B_1$ field is preferably better than about ±6 dB, more preferably better than about ±3 dB, even more preferably better than about ±2 dB, and most preferably better than about ±1.5 dB.

Similarly, each coil 62, 64, 66, 68 comprises first and second return path conductors that respectively transfer the current between the first and second set of primary path conductor segments. As such, again using posterior I-channel coil 66 (FIG. 4) as an example, each of the first and second return path conductors 104 and 106 has a current amplitude $I_3=I_1+I_2$. First and second return path conductors 104 and 106 are in communication with primary path conductor segments 82 and 94 through conductive paths 108–111. First and second return path conductors 104 and 106 each return the electrical current from one end of each set of primary path conductor segments 82 and 94 to the opposite end of the opposing set of primary path conductors. Each of first and second return path conductors 104 and 106 is serially-connected to each set of primary path conductor segments 82 and 94 to form a continuous circuit. In this manner, current enters and exits first and second set of primary path conductor segments 82 and 94 in a similar manner. As a result, the current flowing in first set of primary path conductor segments 82 flows in the same direction as the current flowing in second set of primary path conductor segments 94 within each RF coil.

Return path conductors 104 and 106 are preferably arcuate in shape. More preferably, conductors 104 and 106 lie within substantially the same diameter substantially symmetrically disposed about an axis parallel to central axis 86. By positioning conductors 104 and 106 along substantially the same circular path, the homogeneity of $B_1$ field 40 and the sensitivity drop-off outside of imaging volume 12 are substantially isotropic, i.e. having the same magnitude in any direction from iso-center 88. One skilled in the art will realize, however, that other shapes may be utilized for the return path conductors. These structures include non-circular arcuate shapes, rectangles, squares and the like. The use of these structures versus the preferred circular path, however, generally results in more losses, reduced coil sensitivity and an anisotropic drop-off. Thus, one skilled in the art will realize that the shape of the return path conductors may vary and still fall within the scope of the present invention.

The present invention preferably provides first return path conductor 104 and second return path conductor 106 positioned in the same I-channel circular path having a radius $r_I$. Similarly, referring to FIG. 3, each Q-channel coil such as coil 68 advantageously comprises a first return path conductor 116 and a second return path conductor 118 positioned in substantially the same Q-channel circular path having a radius $r_Q$. Q-channel first and second return path conductors 116 and 118 are serially connected to each of first and second set of primary path conductor segments 117 and 119. The value of each radius $r_I$ and $r_Q$ is determined according to the Biot-Savart law to produce a sharp drop-off in sensitivity outside of imaging volume 12. The sharp drop off in sensitivity reduces the aliasing of signal from outside of imaging volume 12. The positioning of the return path conductors of RF coil system 61 provides a sensitivity drop-off better than about −10 dB, more preferably better than about −15 dB, even more preferably better than about −20, and most preferably better than about −30 dB.

Further, referring to FIG. 3, the Q-channel return path conductors 116 and 118 are radially spaced from the I-channel return path conductors 104 and 106 (i.e. $r_Q>r_I$) to provide isolation between the channels and minimize energy loss. If the I- and Q-channel coils for each RF coil set 36 and 38 were identical, then the return path conductors for each RF coil set would be right on top of each other. If the return path conductors were superimposed, then a high capacitance between the return path conductors would be created that would possibly give rise to poor isolation, or a noise or energy transfer, between the I- and Q-channels. The spacing between the return path conductors, or the difference between $|r_Q-r_I|$, preferably provides an isolation of better than about −15 dB, and more preferably better than about −20 dB. Thus, first and second return path conductors 104, 116 and 106, 118 for each I- and Q-channel coil, respectively, are positioned to maximize isolation between channels and to achieve a sharp drop-off in sensitivity outside of the imaging volume while achieving the desired homogeneity of the circular, polarized $B_1$ field 40 generated by the RF coils.

Figure 5:
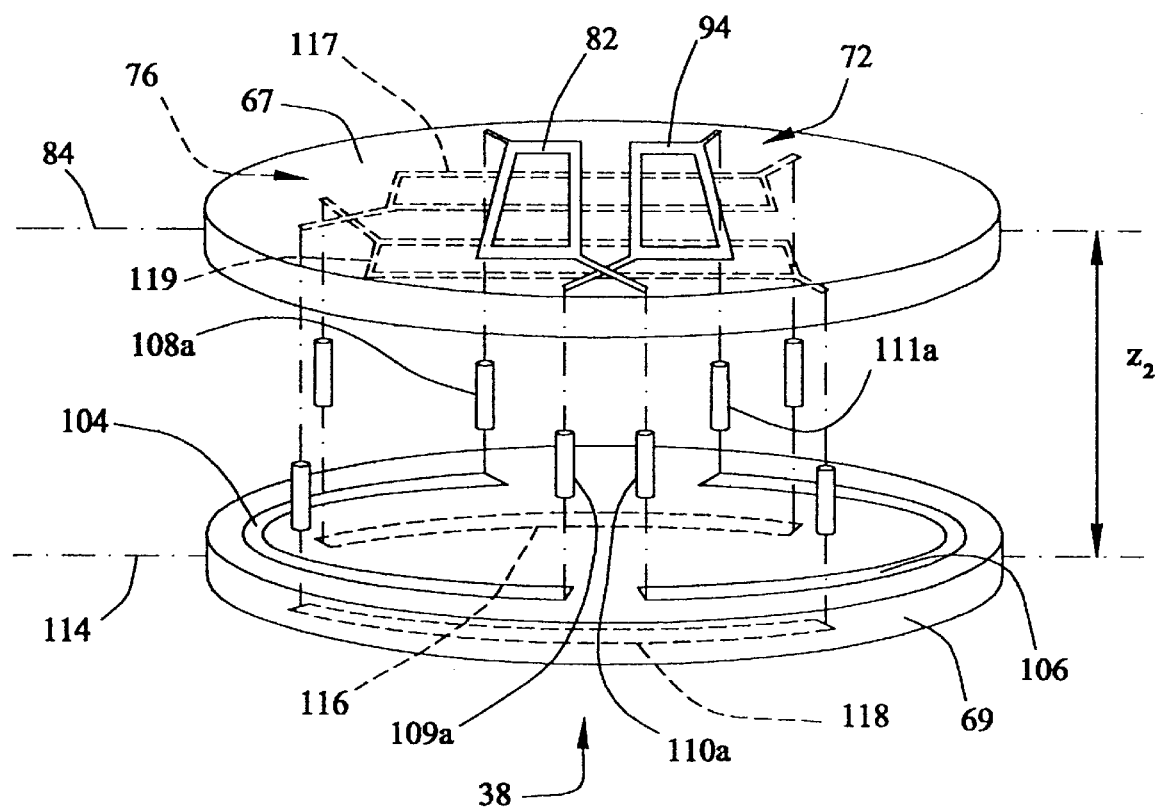
FIG. 5 is a top plan view of a first circuit board containing the primary path conductor segments of the posterior RF coil set of FIG. 3.
Figure 7:
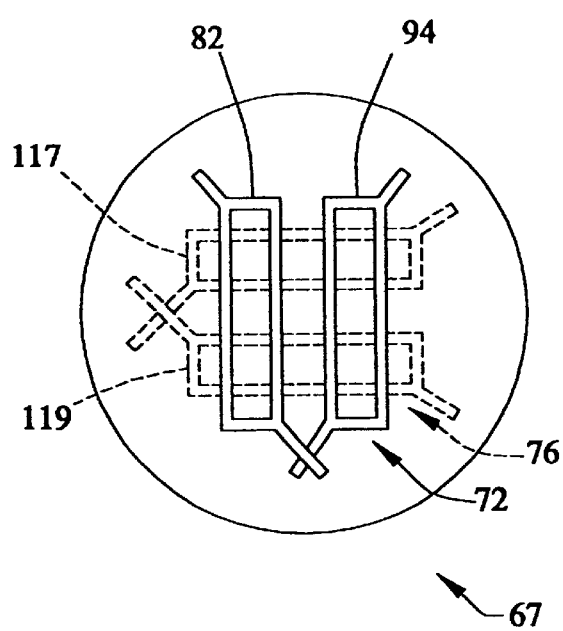
FIG. 7 is an exploded front perspective view of the circuit boards of FIGS. 5–6.
Figure 6:
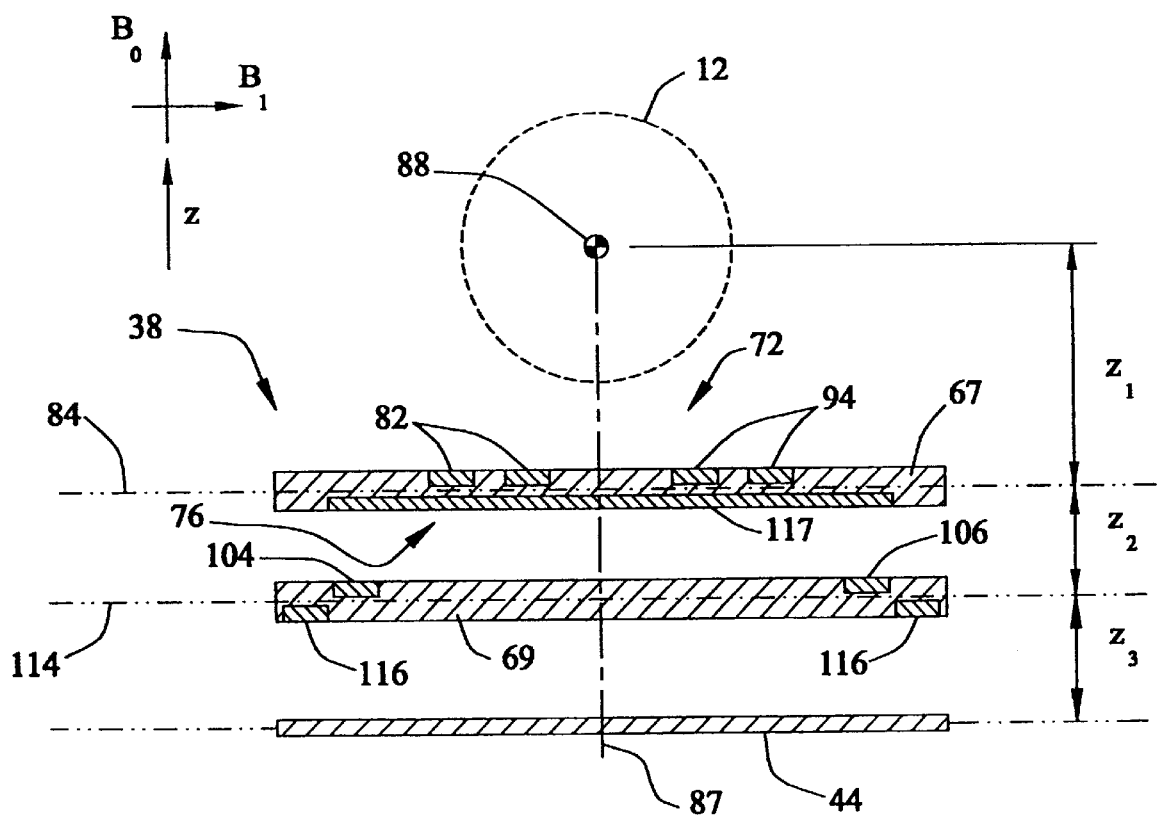
FIG. 6 is a top plan view of a second circuit board containing the return path conductor segments of the posterior RF coil set of FIG. 3.

Referring to FIGS. 5 and 6, according to the present invention, the primary path conductors are advantageously positioned in a first plane 84 that is substantially separated from a second plane 114 that contains the return path conductors. The separation of the primary and return path conductors beneficially allows the high amplitude current carried by the return path conductors to be moved away from the patient 11, thereby reducing SAR exposure and optimizing the rate of sensitivity drop-off. Meanwhile, the higher amplitude current carrying return path conductors still contribute to the homogeneity of $B_1$ field 40 and the sensitivity drop-off.

Figure 8:
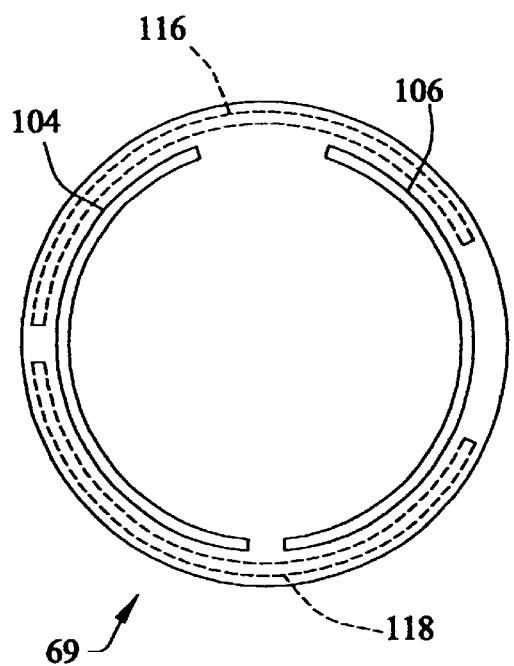
FIG. 8 is a cross-sectional view of the circuit boards of the posterior RF coil set, similar to FIG. 7, within the MR magnet assembly.

Referring to FIGS. 5–8, using posterior coils 66 and 68 as an example, preferably the primary path conductors 72 and 76 are traces on a first circuit board 67 (FIG. 7), while the return path conductors 104, 106, 116 and 118 are traces in a second circuit board 69 (FIG. 8). Ideally, the traces for each channel are placed on the same surface of each circuit board 67, 69. For example, I-channel primary path conductors 72 are on the top surface of first circuit board 67, while I-channel return conductors 104 and 106 are on the top surface of second circuit board 69. Similarly, Q-channel conductors 76 and 116, 118, respectively, are on the bottom surface of circuit boards 67 and 69, respectively.

As is known in the art, each circuit board 67 and 69 comprises FR4™ material and TEFLON® material with copper traces etched into the surface. Other structures may be utilized, however, such as strips of copper or other electrically conducting material positioned to match the structure disclosed herein. The thickness of each circuit board 67 and 69 is relatively thin, preferably from about 15 mils to 65 mils (1 mil=0.001 inch), and thus the conductors on each surface can be considered to be in substantially the same plane.

Referring to FIG. 5, the conductive paths 108–111 from coil 66, for example, include conductive extensions 108a–111a that extend between circuit boards 67 and 69 to connect the primary path conductors 72 to the respective return path conductors 104, 106. Conductive extensions 108a–111a may include rivets and eyelets, pins, wires or other similar devices that can be used to make an electrical connection over a distance.

Additionally, referring to FIG. 6, each coil of RF coil system 61 (such as the RF coils of posterior coil set 38) positions primary path conductors and return path conductors relative to iso-center 88 to produce a desired homogeneity in $B_1$ field 40, to produce a desired sensitivity drop-off outside of the imaging volume, and to reduce the SAR exposure of patient 11. Second plane 114 is spaced apart from first plane 84 by a specified distance $z_2$ along an axis orthogonal to the planes. First plane 84 containing primary path conductors 72 and 76 is spaced a distance $z_1$ from iso-center 88. Similarly, second plane 114 is spaced a distance $z_1+Z_2$ from iso-center 88 and a distance $Z_3$ from RF shield 44. Since the square of the current is proportional to the SAR exposure of patient 11, second plane 114 is spaced further away from iso-center 88 because of the greater current flowing through first and second return path conductors 104, 106 and 116, 118. Further, this positioning of the return path conductors reduces their effect on $B_1$ field 40 within imaging volume 12, as the amount of current in a conductor has a proportional effect on the $B_1$ field. Thus, the relative positioning of the return path conductors and the primary path conductors combines to minimize the SAR exposure of patient 11 while optimizing the homogeneity of $B_1$ field 40 and the sensitivity drop-off.

In order to define the structure of each RF coil to meet a desired level of homogeneity of the $B_1$ field with respect to the iso-center, the above-identified structure may be entered into a Biot-Savart iteration program. The Biot-Savart iteration program applies the Biot-Savart law to a conductor structure to determine the resultant $B_1$ field. The Biot-Savart law is a vector expression that determines the $B_1$ field at a point (x, y, z) from any arrangement of currents, as follows:

$$\vec{B}_{1(x,y,z)} = \oint \frac{\mu_0 I}{4\pi R^3} \vec{ds} \times \vec{R} \quad (1)$$

where:

$\mu_0$=permittivity;
I=the amplitude of the current;
R=the distance between ds and (x,y,z);
$\vec{ds}$=the conductor segment; and
$\vec{R}$=the vector between ds and (x,y,z).

As realized by one skilled in the art, the Biot-Savart iteration program calculates the $B_1$ field 40 for numerous points (x, y, z) within imaging volume 12 to determine the cumulative $B_1$ field 40 based on the given structure of the RF coil. The Biot-Savart iteration program utilizes the following degrees-of-freedom:

(1) distance between the return path conductors and the RF shield;
(2) distance between the primary path conductors and the RF shield;
(3) positioning of the return path conductors;
(4) number of primary path conductors;
(5) distance between all sets of primary path conductors; and
(6) current ratio between the primary path conductors.

Running the iteration program results in a solution for a desired homogeneity of the $B_1$ field 40. The coil structure and desired homogeneity can be determined when parameters are given for variables such as the desired homogeneity, the size of imaging volume, the spacing from coil to iso-center and the maximum distance between the RF shield and the coil, for example. There may be trade-offs in other areas, however, such as the efficiency of the RF coil and the local SAR. Yet, as is known by those skilled in the art, these trade-offs may be taken into account in the boundary conditions of the program. The iteration program may vary the degrees of freedom to determine a solution. The above-identified quadrature structure with the plurality of primary path conductors and the radially outward positioned return path conductors results in a highly efficient RF coil system with a fast sensitivity drop-off and a larger magnitude $B_1$ field for the same power as compared to prior art systems. Thus, the structure of RF coil system may be determined to meet any desired homogeneity of the $B_1$ field, as well as taking into account other boundary conditions, for any imaging volume.

In operation, referring to FIG. 2, RF transmitter 34 (FIG. 1) provides power through co-axial cables to energize RF coil system 61. During an MR pulse sequence, a transmit amplifier within RF transmitter 34 is operated to generate the RF excitation signal $e_T$. An RF transmit/receive (T/R) switch 120 is synchronously operated to couple the excitation signal $e_T$ to a first power splitter device 122. First power splitter device 122 passes the excitation signal $e_T$ at 0 degrees to anterior coil set 36 as RF excitation signal $e_{Ta}$, while delaying the signal $e_T$ by 180 degrees to provide RF excitation signal $e_{Tp}$ to posterior coil set 38. An anterior power splitter device 124 passes the signal $e_{Ta}$ at 0 degrees to the anterior I-channel as RF excitation signal $e_{TaI}$, while delaying the signal $e_{Ta}$ by 90 degrees to provide the anterior Q-channel RF excitation signal $e_{TaQ}$. Similarly, a posterior power splitter device 126 passes the signal $e_{Tp}$ at 180 degrees to the posterior I-channel as RF excitation signal $e_{TpI}$, while delaying the signal $e_{Tp}$ by 90 degrees to provide the posterior Q-channel RF excitation signal $e_{TpQ}$. Thus, the phase of each of the signals varies such that $e_{TaI}$=0 degrees, $e_{TaQ}$=90 degrees, $e_{TpI}$=180 degrees, and $e_{TPQ}$=270 degrees.

Additionally, before reaching its respective coil, each signal $e_{TaI}$, $e_{TaQ}$, $e_{TpI}$, and $e_{TpQ}$ is passed through a balance/unbalance (BALUN) device 128 which improves isolation between the I- and Q-channel coils for the respective anterior and posterior coil set 36 and 38. In the 90 degree splitter devices 124 and 126, for example, the grounds of the respective I- and Q-channels are connected and thus are at the same potential. This can create a ground loop, which may reduce the isolation between the I- and Q-channels. When using splitter devices for a quadrature RF coil system, however, it is important to provide good isolation between the I- and Q-channels so that noise from one channel is not picked up in the other channel. Any transmission of noise from one channel to another reduces the signal-to-noise ratio advantage provided by a quadrature coil. Therefore, it is desirable to separate the grounds as defined in the respective coil from the grounds that are defined in the splitter device. BALUN device 128 forms a high impedance on the ground shield of the coaxial cables delivering each signal in order to isolate the different grounds. Preferably, BALUN device 128 provides signal isolation of better than about −15 dB, more preferably −20 dB, and most preferably −30 dB. Thus, BALUN device 128 eliminates the ground loop and prevents noise in one channel from leaking into the other channel to maintain the high signal-to-noise ratio of the respective quadrature anterior and posterior coil set 36 and 38.

After passing through BALUN device 128, each signal $e_{TaI}$, $e_{TaQ}$, $e_{TpI}$, and $e_{TpQ}$ is fed into an input circuit 130. Using posterior I-channel coil 66 as an example, referring to FIGS. 3 and 9, input circuit 130 includes tuning circuit 132 that comprises capacitors 134 and 136 and trimmer capacitor 142. Along with all of the other capacitors 137–141 distributed about circular conductors 104 and 106, tuning circuit 132 determines the resonance frequency of coil 66. The resonance frequency can be fine tuned by adjustment of trimmer capacitor 142. As known by those skilled in the art, the value of the capacitors varies depending on the inductance and the resonance frequency of the coil.

Figure 9:
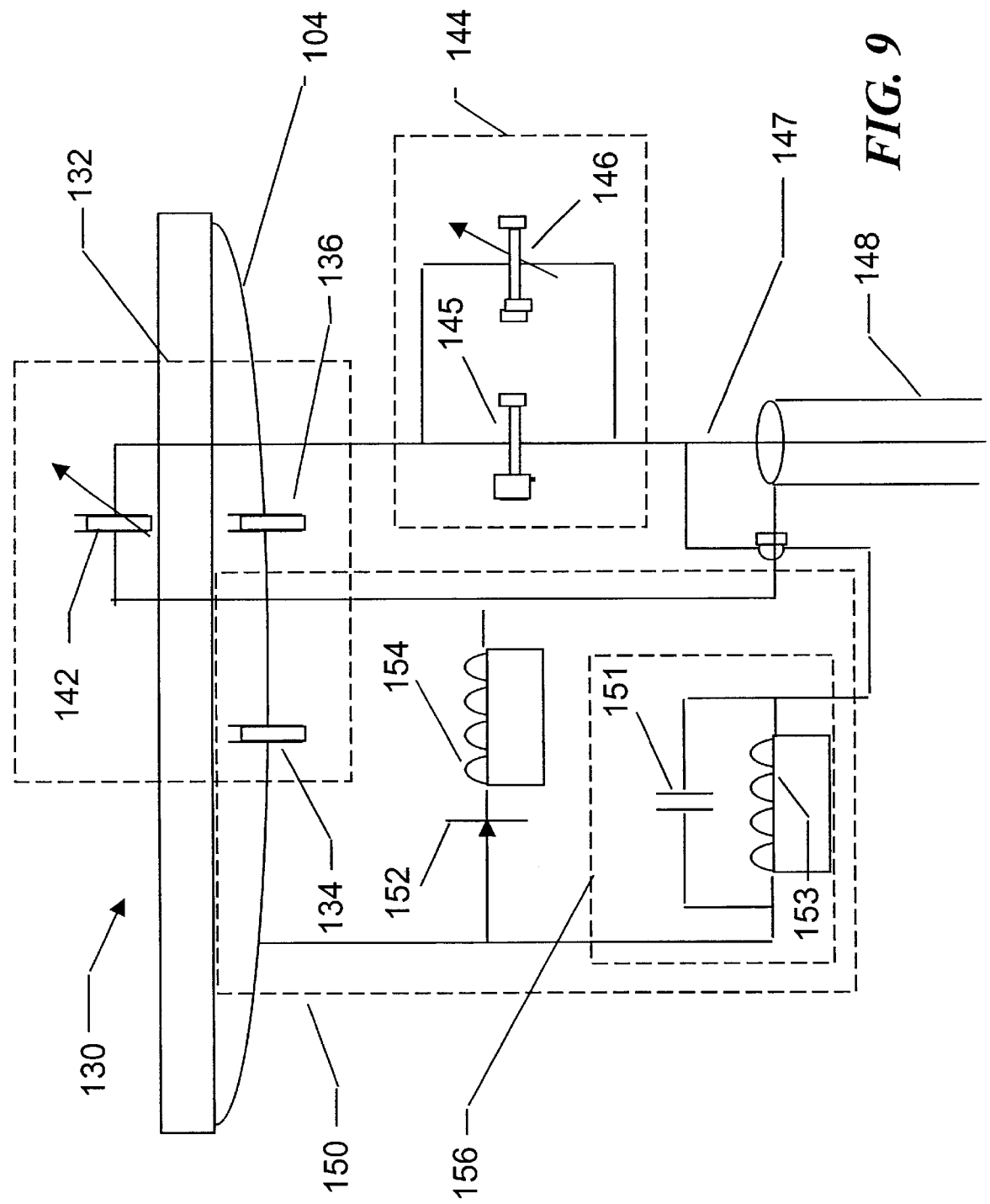
FIG. 9 is a schematic diagram of an input circuit of the present invention.

Additionally, referring to FIG. 9, input circuit 130 includes a matching circuit 144 comprising capacitor 145 and trimmer capacitor 146 in parallel, with the matching circuit in series with center conductor 147 of co-axial cable 148. Again, as realized by those skilled in the art, the value of the capacitors varies depending on the inductance and resonance frequency. Matching circuit 144 is utilized to change the impedance of coil 66, for example, as seen by the output of co-axial cable 148. Preferably, capacitors 145 and 146 adjust the impedance of coil 66 to be set to a value for most efficient energy transfer from the power amp to the coil. Or, in case of a receive coil, the impedance of coil 66 is adjusted to a value that minimizes the noise figure of the preamplifier. Typically, the impedance is adjusted to 50 ohms real impedance.

Further, input circuit 130 includes a decoupling network 150 comprising capacitors 134 and 151, diode 152 and inductors 153 and 154. As described above, the value of the capacitors, diodes and inductors within input circuit 130 vary depending on the other system parameters. Decoupling network 150 prevents coil 66, for example, from receiving emitted MR response signals when it is desired to receive these signal utilizing another coil inside of the imaging volume. Also, decoupling network 150 prevents RF energy dissipation during a transmit pulse with a different transmit coil placed inside this whole body coil. To activate decoupling network 150, a forward bias DC current is applied through diode 152 to make it look like a short. In that case, inductor 154 is then resonant with capacitor 134 forming a parallel tank resonator, which is resonant at the same frequency as coil 66. The parallel tank resonator introduces a very high impedance to the return path conductor 104, which decouples coil 66. The DC current is supplied by center conductor 147 of co-axial cable 148 through choke circuit 156 comprising inductor 153 and capacitor 151. Choke circuit 156 allows the DC current from center conductor 147 to pass through inductor 153, but blocks the RF signal from passing from coil 66 to co-axial cable 148. Choke circuit 156 blocks the RF signal from coil 66 by forming a parallel resonator, with inductor 153 and capacitor 151, that has a very high impedance. On the other hand, during an RF transmit pulse, diode 152 is back-biased with a large voltage to insure that RF energy is not flowing through the diode. As is known to those skilled in the art, the voltages used to forward and back-bias diode 152 depend upon the peak voltage of the system. Coil switch bias device 158 (FIG. 2) is connected to anterior and posterior power splitter devices 124 and 126 to open and close diode 152 on input circuit 130.

Figure 10:
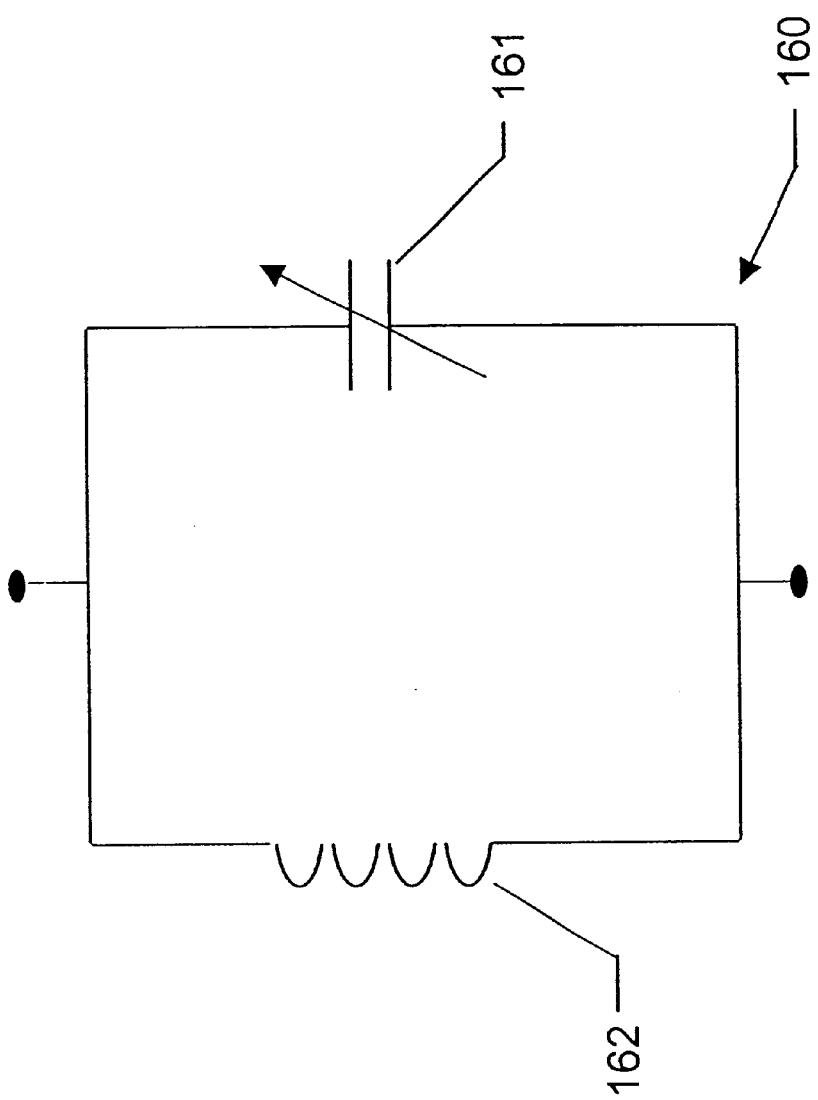
FIG. 10 is a schematic diagram of an isolation circuit of the present invention.

Yet further, referring to FIGS. 2, 3 and 10, isolation circuit 160 connects the return path conductors of the I- and Q-channel coils of each coil set 36 and 38 to optimize the isolation between the I- and Q-channels. Isolation circuit 160 provides an isolation between channels of better than about −15 dB, preferably better than about −20 dB, and most preferably better than about −25 dB. With either quadrature coil set 36 or 38, the respective I- and Q-channel coils 62 and 64 or 66 and 68 are positioned right on top of each other. Although the respective I- and Q-channel coils 62 and 64 or 66 and 68 are shifted by 90 degrees from each other, there is typically a rest amount of inductive or capacitive coupling between the coils which causes the isolation between the channels to be non-ideal. A rest inductance between two coils may be caused, for example, by the coils not being perfectly 90 degrees out of phase with each other. This rest inductance can be eliminated by putting a capacitor in parallel with the rest inductance. Similarly, capacitive coupling between two coils may occur, for example, when the return path conductors of the coils are too close to each other, causing RF energy to leak from one coil to the other. This is known as parasitic capacitance, and can be eliminated by placing the parasitic capacitance into a parallel resonator with an inductor. Since it is not known whether the coupling between the I- and Q-channel coils will be capacitive or inductive, isolation circuit 160 advantageously comprises a capacitor 161 and an inductor 162 in parallel between the I- and Q-channel coils of each coil set 36 and 38 to handle either situation. When circuit 160 is resonant at the same frequency as the coil described herein, then it is a high impedance. If circuit 160 resonates at a lower frequency, then it behaves like a capacitor. If circuit 160 resonates at a higher frequency, then it behaves like an inductor. Thus, isolation circuit 160 optimizes the isolation between the I- and Q-channel coils of each quadrature coil set 36 and 38.

During the acquisition phase of the RF pulse sequence, received MR signal components $e'_I$, and $e'_Q$ are respectively detected by receiver 54 or anterior and posterior RF coil sets 36 and 38. Referring to FIG. 2, for example, if coil sets 36 and 37 are used, the received MR signal components $e'_{aI}$, $e'_{aQ}$, $e'_{pI}$ and $e'_{pQ}$ are coupled back to anterior and posterior power splitter devices 124 and 126, forming $e'_a$ and $e'_p$. The signals $e'_a$ and $e'_p$ are then forwarded to first power splitter device 122. First power splitter device 122 operates on $e'_a$ and $e'_p$ to produce a resultant received MR signal $e'_R$, which is coupled to T/R switch 120. During such acquisition phase, switch 120 is operated to couple the received MR signal to receiver 54 (FIG. 1), which amplifies such signal for further processing in accordance with well-known MR techniques.

When the respective coils of anterior and posterior RF coil sets 36 and 38 are driven by the I- and Q-channel excitation signals, the magnetic field components generated thereby in imaging volume 12 are additive therein to provide a resultant circular, polarized $B_1$ field 40. As mentioned above, $B_1$ field 40 may have any desired homogeneity. The $B_1$ field 40 flips the nuclear spins in an MR patient or other subject from alignment with the z-axis into the transverse x-y plane, in accordance with MR practice. Also, the circular, polarized $B_1$ field 40 produced by guadrature RF coil system 61 of the present invention advantageously requires less amplitude to excite the nuclear spins, compared to a linear RF coil system.

EXAMPLE

The invention is further illustrated with the following non-limiting example. A practical problem was to construct an RF Body Coil system for an open, vertical $B_0$ field magnet with a homogeneity of about ±3 dB inside an approximately 40 cm diameter sphere imaging volume. Outside of the imaging volume, the field was to drop-off by about −20 dB at about 35 cm from iso-center to prevent aliasing from gradient warp. The thickness ($Z_2+Z_3$) of the anterior/posterior half of the RF Body Coil system, in combination with the RF shield, was less than about 23 cm. The diameter of the magnet pole piece, and hence the maximum diameter of the RF Coil system, was about 92 cm. The solution found was an RF coil, as in FIG. 3, having 4 primary path conductors symmetrically spaced about 4 cm ($x_1$) and 15 cm ($x_2$), respectively, from about the center of the coil. The spacing of the outermost conductors to the center of the coil may range from about 15.5 cm to 17.5 cm, preferably about 16.0 cm to 17.0 cm, most preferably about 16.5 cm. Similarly, the spacing of the innermost conductors to the coil center may range from about 3.0 cm to 5.0 cm, more preferably 3.5 cm to 4.5 cm, and most preferably about 4.0 cm. The peak current amplitude in each outermost primary path conductor was about 34 A ($I_2$), while the peak current amplitude of each inner primary path conductor was about 17 A ($I_1$). The current amplitudes may each vary by about ±2.5 A. Thus, the return path current amplitude was about 51 A ($I_3$). As discussed above, however, the peak current amplitudes will vary depeding on the required amplitude of the $B_1$ field. The return path conductors for the I-channel coil were given a radius of about 38 cm ($r_I$), while the return path conductors for the Q-channel coil were given a radius of about 39 cm ($r_Q$) to create the fast sensitivity drop-off outside of the imaging volume. The value of $r_I$, however, may range from about 36 cm to 40 cm. Similarly, the value of $r_Q$ may range from about 37 cm to 41 cm. Therefore, $|r_Q-r_I|$ is about 2 cm preferably and may range from about 0.1 cm to 5 cm. Additionally, the return path conductors were recessed about 13 mm ($Z_2$) from the primary path conductors, with a distance of about 10 mm ($Z_3$) to the RF shield, to meet local SAR limitations and to optimize sensitivity drop-off and homogeneity. As such, $Z_2$ was preferably about 13 mm, but may range from about 10 mm to 15 mm. Similarly, $Z_3$ may range from about 8 mm to 12 mm. Also, $z_1$ was preferably about 243 mm, ranging from about 240 mm to 250 mm.

Further, matching circuit 144 was set to adjust the impedance of the coil to be about 50 ohms real impedance. Similarly, a forward bias DC current of about 500 mA was applied through diode 152 to actuate decoupling network 150. Meanwhile, diode 152 was back-biased with about 1000V DC current. Also, isolation circuit 160 was provided with a capacitance ranging from about 1 pF to 10 pF, preferably 5 pF, and an inductance ranging from about 2 $\mu$H to 4 $\mu$H, preferably 3 $\mu$H. Again, as discussed above, these values will vary depending on the resonance frequency of the coil.

Figure 11:
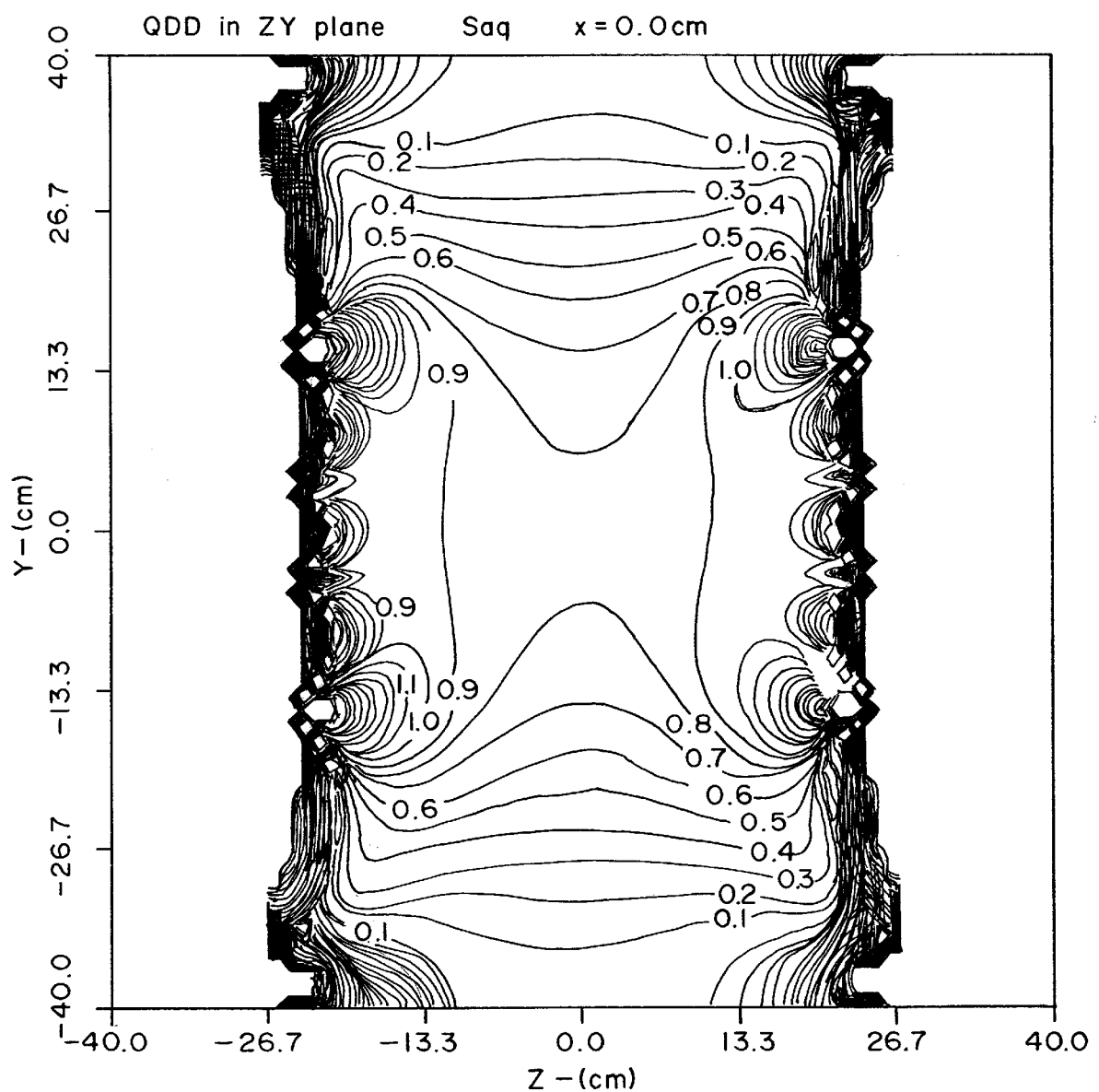
FIG. 11 is a plot of a projected magnetic $B_1$ field in the Y-Z plane provided by the embodiment of FIG. 1.
Figure 12:
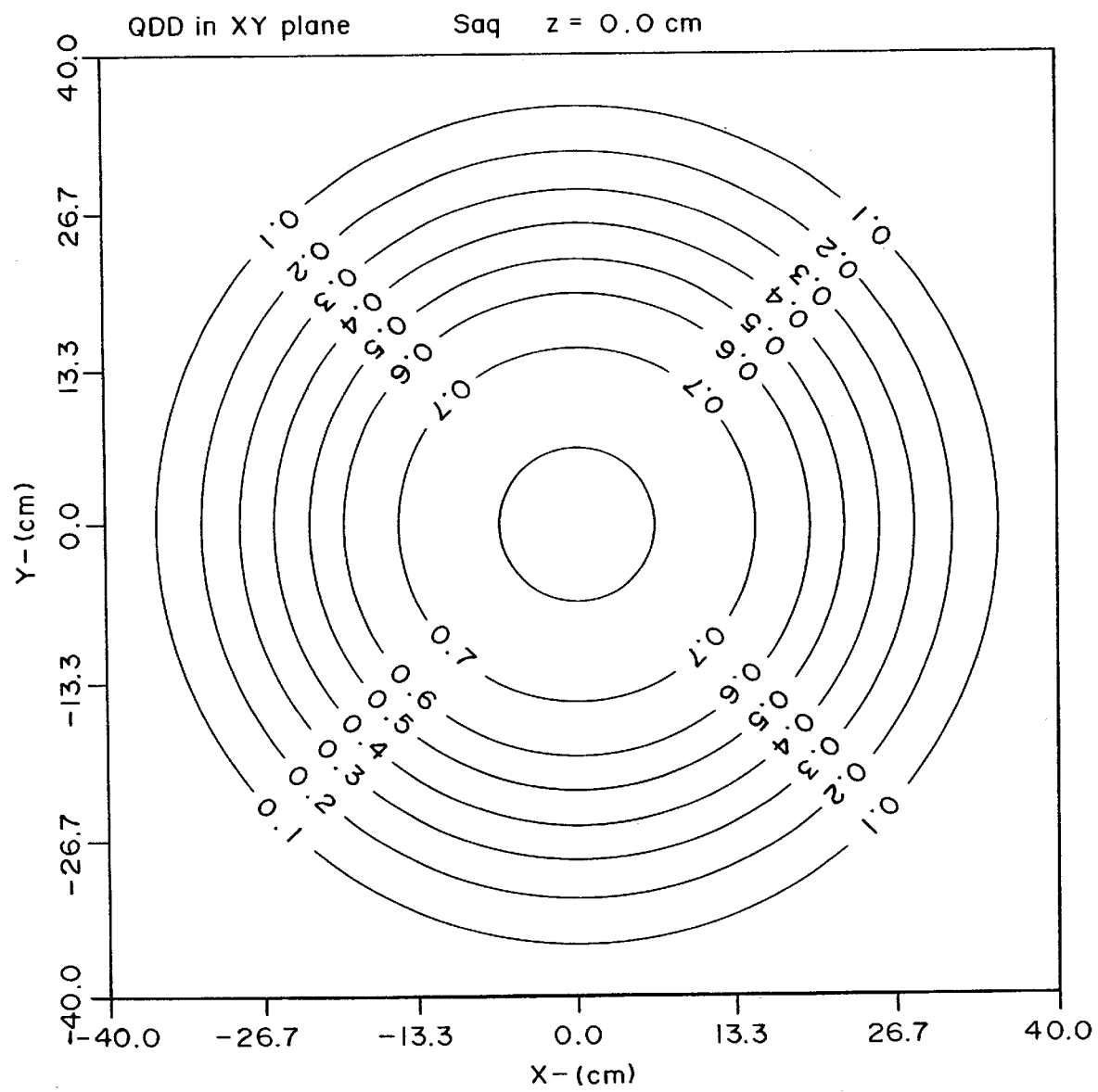
FIG. 12 is a plot of a projected magnetic $B_1$ field in the X-Y plane provided by the embodiment of FIG. 1.
Figure 13:
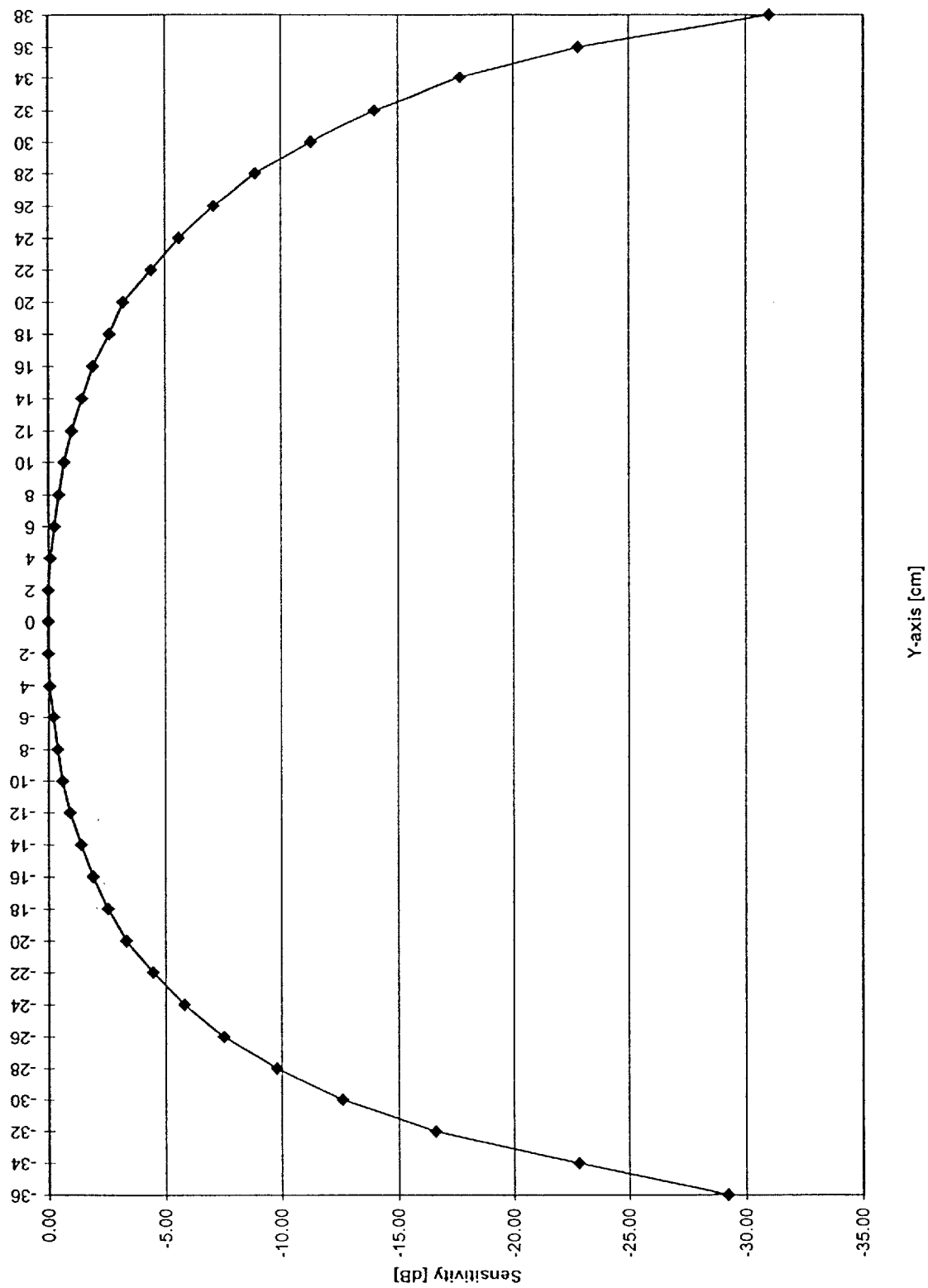
FIG. 13 is a plot of the projected magnetic field, in dB's, on the Y-axis.

Referring to FIGS. 11–12, there is shown a plot of such resultant magnetic field in the y-z plane at x=0.0 and x-y plane at z=0.0, respectively. Such plots show the y-z and x-y projections, respectively, of the magnetic field for an 40 cm sagittal field-of-view provided by RF coil system 61 to have very high homogeneity and a very sharp drop-off outside of the 40 cm imaging volume. Additionally, referring to FIG. 13, there is shown a plot of the measured $B_1$ field in dB's on the y-axis through the iso-center and perpendicular to the $B_0$ magnetic field. Again, such plot shows RF coil system 61 to have a very high homogeneity and a very sharp drop-off outside of the 40 cm imaging volume.

In this example, only 4 straight conductors per channel are shown. As one skilled in this art will realize, increasing the number of straight conductors provides the ability to change more current ratios. Increasing the number of current ratios allows greater degrees of freedom to achieve a desired homogeneity. Thus, the present invention contemplates utilizing at least four straight conductors per channel.

Further, as one skilled in the art will realize, the values for the components of the present invention vary depending on the distances, inductances, number of straight conductors, resonance frequency of the coil, etc. Thus, any values given above are for illustrative purposes and are not to be considered limiting.

Although the invention has been described with reference to these preferred embodiments, other embodiments can achieve the same results. The number of degrees of freedom may be increased, for example by adding more straight conductor segments, to improve on the ability to define the homogeneity of the $B_1$ field within the imaging volume. As such, variations and modifications of the present invention will be apparent to one skilled in the art and the following claims are intended to cover all such modifications and equivalents.

What is claimed is:

1. At least one RF coil, comprising:
    a first and second set of a plurality of parallel-connected primary path conductors for passing electrical current to create a $B_1$ field, said first set of conductors positioned substantially parallel to said second set of conductors symmetrically about a centerline dividing said RF coil, wherein said $B_1$ field has a desired homogeneity within an imaging volume resulting from said positioning and from a predetermined current amplitude of each conductor within each of said first and second set when said electrical current energizes each of said first and second sets of primary path conductors; and
    a first and second return path conductor for transferring said electrical current between said first and second sets of primary path conductors, said first and second return path conductors symmetrically spaced on each side of said centerline, said first and second return path conductors having an outward position further away from said centerline than said first and second sets of primary path conductors resulting in a desired sensitivity drop-off of said $B_1$ field outside of said imaging volume when said RF coil is energized by said electrical current.

2. At least one RF coil as recited in claim 1, wherein said first and second set of primary path conductors are in a first plane and said first and second return path conductors are in a second plane, wherein said first plane is substantially spaced apart from said second plane.

3. At least one RF coil as recited in claim 2, wherein said return path conductors are positioned with respect to an object to be imaged such that a specific absorption ratio (SAR) within said object is less than or equal to a predetermined specific absorption ratio (SAR) when said RF coil is energized.

4. At least one RF coil as recited in claim 2, wherein said first plane is a first predetermined distance from an iso-center of said imaging volume, wherein said second plane is a second predetermined distance from said iso-center, and wherein said second predetermined distance is greater than said first predetermined distance.

5. At least one RF coil as recited in claim 2, wherein each of said plurality of parallel-connected primary path conductors within each of said first set and said second set have a predetermined spacing from said centerline, wherein said predetermined spacing is a function of said desired homogeneity.

6. At least one RF coil as recited in claim 1, wherein said desired homogeneity is in the range of about −6 dB to about +6 dB in an x-y plane within said imaging volume, and wherein said desired sensitivity drop off is equal to or greater than about 10 dB in an x-y plane substantially adjacent to and outside of said imaging volume.

7. At least one RF coil as recited in claim 6, wherein said first and second return path conductors comprise a structure selected from the group consisting of an arcuate shape, a rectangular shape, and a square shape.

8. At least one RF coil as recited in claim 1, wherein each of said first and second set of primary path conductors comprise more than two conductors electrically connected in parallel.

9. At least one RF coil as recited in claim 8, wherein said predetermined current amplitude in each primary path conductor of said first and second set of primary path conductors increases with the distance from said centerline.

10. At least one RF coil as recited in claim 8, wherein said at least two conductors have a predetermined current amplitude ratio to achieve said desired homogeneity.

11. At least one RF coil system as recited in claim 1, wherein said desired homogeneity is in the range of about −6 dB to about +6 dB.

12. At least one RF coil as recited in claim 1, wherein said desired homogeneity is a function of:
    a predetermined distance to said centerline for each conductor of said first and second set of primary conductors;
    a predetermined and independently variable current amplitude ratio between each conductor of said first and second set of primary path conductors;
    a predetermined distance to an iso-center of said imaging volume for each conductor of said first and second set of primary path conductors; and
    said outward position of said first and second return path conductors.

13. A method of creating a magnetic field having a desired homogeneity within an imaging volume, comprising:
    energizing at least one RF coil having two sets of a plurality of parallel-connected primary path conductors and having return path conductors, wherein the sets of primary path conductors are disposed on each side of, and parallel to, a centerline of the RF coil, wherein the primary path conductors have a predetermined spacing from the centerline to provide the desired homogeneity, wherein a predetermined, independently-variable current amplitude ratio exists between each conductor of each primary path conductor set, and wherein the return path conductors are outwardly positioned from the primary path conductors to provide a desired sensitivity drop off outside of the imaging volume.

14. A method as recited in claim 13, wherein the return path conductors have a predetermined recessed position, relative to the primary path conductors, sufficient to provide a desired limitation to a specific absorption ratio (SAR) within an object to be imaged.

15. A method as recited in claim 13, wherein energizing further comprises supplying the RF coil with an electrical current sufficient to create the magnetic field with a strength sufficient for diagnostic imaging.

16. A magnetic resonance (MR) system for diagnostic imaging, comprising:
    an MR magnet comprising a pair of magnet pole pieces positioned on opposing sides of an imaging volume;
    an RF coil system comprising:
        a pair of RF coil components positioned on opposing sides of said imaging volume, each of said RF coil components comprising a plurality of conductive loops, the conductive loops of each of said RF coil components comprising:
            a first and second set of primary path conductor segments for passing electrical current to create a $B_1$ field having a desired homogeneity within said imaging volume, said first and second set of primary path conductor segments positioned parallel to each other and symmetrically about a first centerline in a first plane, each conductor within each respective said first and second set of primary path conductor segments electrically connected in parallel;
            a first and second return path conductor segment for providing a return path for said electrical current each serially-connected to opposite ends of said first and second set of primary path conductor segments, each of said first and second return path conductor segments positioned radially outward from said first and second set of primary path conductor segments and symmetric to each other about a second centerline in a second plane that is substantially parallel to and spaced apart from said first plane;
            wherein each of said first and second set of primary path conductor segments comprise at least a first straight conductor for passing a first current and a second straight conductor for passing a second current, wherein said first straight conductor is a specified spacing from said second straight conductor; and
            wherein said radially outward positioning of said return path conductors, a current amplitude ratio of said first current to said second current, and said specified spacing between said first and second straight conductors combine to provide said desired homogeneity of said $B_1$ field generated by said RF coil system within said imaging volume.

17. MR system as recited in claim 16, wherein said radially outward positioning of said return path conductors provides a first sensitivity of said magnetic field within said imaging volume being substantially greater than a second sensitivity of said $B_1$ field immediately adjacent to said imaging volume, said difference between said first sensitivity and said second sensitivity providing a desired sensitivity drop-off.

18. An MR system as recited in claim 17, wherein said desired sensitivity drop-off comprises at least 10 dB.

19. An MR system as recited in claim 16, wherein said first plane and said second plane are spaced apart by a specified distance along an axis orthogonal to said planes to produce said desired homogeneity of said magnetic field generated by said RF coil system within said imaging volume.

20. An system as recited in claim 16, wherein said radially outward positioning of said return path conductors comprises forming said return path conductors from a structure selected from the group consisting of an arcuate shape, a rectangular shape, and a square shape.

21. An system as recited in claim 16, wherein each of said pair of RF coil components comprises:
    a first channel coil and a second channel coil; and
    an isolation circuit to reduce capacitive and inductive coupling between said first and second channel coils for providing a desired signal isolation between said first and second channel coils.

22. An MR system as recited in claim 21, wherein said desired signal isolation is better than or equal to about −15 dB.

23. An MR system as recited in claim 16, wherein said pair of RF coil components comprise an anterior coil set and a posterior coil set, each of said anterior coil set and said posterior coil set having a plurality of coils defined by said conductive loops.

24. An MR system as recited in claim 23, further comprising:
a first channel coil and a second channel coil defining said anterior coil set,
a third channel coil and a fourth channel coil defining said posterior coil set,
wherein said first and second set of primary path conductor segments associated with said first channel coil are positioned substantially perpendicular to said first and second set of primary path conductor segments associated with said second channel coil.

25. An MR system as recited in claim 24, wherein said first and second set of primary path conductor segments associated with said third channel coil are positioned substantially perpendicular to said first and second set of primary path conductor segments associated with said fourth channel coil.

26. An MR system as recited in claim 25, wherein said first and second set of primary path conductor segments associated with said first channel coil are positioned substantially parallel to said first and second set of primary path conductor segments associated with said third channel coil, and wherein said first and second set of primary path conductor segments associated with said second channel coil are positioned substantially parallel to said first and second set of primary path conductor segments associated with said fourth channel coil.

27. An MR system as recited in claim 26, wherein a current flow through said first channel coil is about 180 degrees out of phase with a current flow through said third channel coil, wherein a current flow through said second channel coil is about 180 degrees out of phase with a current flow through said fourth channel coil, wherein said current flow through said first channel coil is about 90 degrees out of phase with said current flow through said second channel coil, and wherein said current flow through said third channel coil is about 90 degrees out of phase with said current flow through said fourth channel coil.

28. An MR system as recited in claim 16, wherein said pair of RF coil components comprise an anterior coil set and a posterior coil set, each set having a plurality of coils defined by said conductive loops and forming a quadrature coil set.

29. An MR system as recited in claim 28, wherein a current in said anterior coil set is about 180 degrees out of phase with a current in said posterior coil set.

30. An RF coil system for producing a $B_1$ magnetic field within an imaging volume, comprising:
an anterior quadrature coil set adjacent to said imaging volume;
a posterior quadrature coil set opposing said anterior quadrature coil set on an opposite side of said imaging volume;
wherein each of said anterior quadrature coil set and said posterior quadrature coil set comprise a first coil and a second coil;
wherein each of said first coil and said second coil comprise a first set and a second set of a plurality of parallel-connected primary path conductors, each of said first set and said second set serially-connected to a first return path conductor and a second return path conductor, each of said first and second return path conductors outwardly positioned from said first and second set of primary path conductors; and
wherein, when energized, each conductor of each of said first and second primary path conductor sets has an independently-variable, predetermined current amplitude such that each of said first and second primary path conductor sets have a predetermined current amplitude ratio between said conductors.

31. An RF coil system as recited in claim 30, wherein said predetermined current amplitude ratio is a function of a desired homogeneity of said $B_1$ field within said imaging volume.

32. An RF coil system as recited in claim 30, wherein said outward position of said first and second return path conductors is a function of a desired homogeneity of said $B_1$ field within said imaging volume.

33. An RF coil system as recited in claim 30, wherein said imaging volume has an iso-center, wherein each conductor of each of said first and second set of said plurality of primary path conductors and each of said first and second return path conductors have a predetermined position with respect to said iso-center, wherein each predetermined position is a function of a desired homogeneity of said $B_1$ field within said imaging volume, a desired sensitivity drop-off outside of said imaging volume, and a desired limitation to a specific absorption ratio (SAR) within an object to be imaged.

34. An RF coil system as recited in claim 33, wherein said desired homogeneity and said desired sensitivity drop-off are substantially isotropic in an x-y plane from an iso-center of said imaging volume.

35. An RF coil system as recited in claim 34, wherein said desired homogeneity is in the range of about −6 dB to about +6 dB.

36. An RF coil system as recited in claim 34, wherein said desired sensitivity drop off is greater than or equal to about 10 dB at a point substantially adjacent to said imaging volume.

37. An RF coil system as recited in claim 30, further comprising an isolation circuit between each first and second coil pair, said isolation circuit comprising a predetermined capacitance electrically-connected in parallel with a predetermined inductance, said predetermined capacitance sufficient to substantially eliminate an inductive coupling between said coil pair, and said predetermined inductance sufficient to substantially eliminate a capacitive coupling between said coil pair.

* * * * *